United States Patent
Chieh et al.

(10) Patent No.: US 9,825,349 B2
(45) Date of Patent: Nov. 21, 2017

(54) ULTRA-WIDEBAND RADIAL WAVEGUIDE TO COAXIAL COMBINER/DIVIDER

(71) Applicant: THE UNITED STATES OF AMERICA AS REPRESENTED BY THE SECRETARY OF THE NAVY, Washington, DC (US)

(72) Inventors: Jia-Chi S. Chieh, San Diego, CA (US); Aaron Clawson, San Diego, CA (US); Michael Civerolo, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/183,615

(22) Filed: Jun. 15, 2016

(65) Prior Publication Data

US 2017/0271740 A1    Sep. 21, 2017

Related U.S. Application Data

(60) Provisional application No. 62/309,392, filed on Mar. 16, 2016.

(51) Int. Cl.
  *H01P 5/12* (2006.01)
  *H03F 3/55* (2006.01)
  *H01P 5/103* (2006.01)

(52) U.S. Cl.
  CPC ............... *H01P 5/12* (2013.01); *H01P 5/103* (2013.01); *H03F 3/55* (2013.01)

(58) Field of Classification Search
  CPC ...... H01P 5/12; H01P 5/10; H01P 5/08; H01P 5/181; H01P 5/103
  See application file for complete search history.

(56) References Cited

U.S. PATENT DOCUMENTS 2,659,055 A * 11/1953 Cohn .................. H01P 5/103
                                               333/26
2,891,225 A   6/1959 Lewis et al.
(Continued)

OTHER PUBLICATIONS

Yazhou Dong; Shi-wei Dong; Ying Wang, "A 60 GHz solid-state power combining system," Microwave Workshop Series on Millimeter Wave Wireless Technology and Applications (IMWS), 2012 IEEE MTT-S International , vol., No., pp. 1,4, Sep. 18-20, 2012.
(Continued)

*Primary Examiner* — Robert Pascal
*Assistant Examiner* — Kimberly Glenn
(74) *Attorney, Agent, or Firm* — SPAWAR Systems Center Pacific; Kyle Eppele; Ryan J. Friedl (57) ABSTRACT

A system is provided for combining multiple solid-state amplifiers using a radial combiner/divider. The system includes a coaxial input port, a coaxial output port, a first plurality of N waveguides radially disposed around a first transition, a second plurality of N waveguides radially disposed around a second transition, and a plurality of N amplifiers. A first end of each of the first plurality of waveguides is operatively connected to the coaxial input port via the first transition. A first end of each of the second plurality of waveguides is operatively connected to the coaxial output port via the second transition. A first port of each of the plurality of amplifiers is connected to a second end of one of the first plurality of waveguides and a second port of each of the plurality of amplifiers is connected to a second end of one of the second plurality of waveguides.

20 Claims, 9 Drawing Sheets

(56) References Cited

U.S. PATENT DOCUMENTS

| 3,023,382 | A | * | 2/1962 | Borghetti | H01P 5/103 |
|---|---|---|---|---|---|
| | | | | | 333/252 |
| 3,087,127 | A | * | 4/1963 | Borghetti | H01P 5/103 |
| | | | | | 333/248 |
| 3,182,272 | A | | 5/1965 | Borghetti | |
| 3,725,824 | A | | 4/1973 | McDonald | |
| 3,737,812 | A | | 6/1973 | Gaudio et al. | |
| 3,942,130 | A | | 3/1976 | Harp | |
| 3,993,966 | A | | 11/1976 | Reindel | |
| 4,234,854 | A | | 11/1980 | Schellenberg et al. | |
| 4,641,106 | A | | 2/1987 | Belohoubek et al. | |
| 4,647,879 | A | | 3/1987 | Vaddiparty | |
| 4,956,614 | A | | 9/1990 | Baril | |
| 5,214,394 | A | | 5/1993 | Wong | |
| 5,920,240 | A | | 7/1999 | Alexanian et al. | |
| 6,982,613 | B2 | | 1/2006 | Wu et al. | |
| 8,928,429 | B2 | | 1/2015 | Song et al. | |
| 2016/0248164 | A1 | * | 8/2016 | Fonseca | G01S 7/4026 |

OTHER PUBLICATIONS

Xiaoyong Shan; Zhongxiang Shen, "A Suspended-Substrate Ku-Band Symmetric Radial Power Combiner," Microwave and Wireless Components Letters, IEEE , vol. 21, No. 12, pp. 652,654, Dec. 2011.

Schellenberg, J.; Watkins, E.; Micovic, M.; Kim, B.; Han, K., "W-band, 5W solid-state power amplifier/combiner," Microwave Symposium Digest (MTT), 2010 IEEE MTT-S International , vol., No., pp. 1,1, May 23-28, 2010.

Denoual, J.-M.; Peden, A; Della, B.; Fraysse, J.-P., "16-Way Radial Divider/Combiner for Solid State Power Amplifiers in the K Band," Microwave Conference, 2008. EuMC 2008. 38th European , vol., No., pp. 345,348, Oct. 27-31, 2008.

C. Y. Law and A.-V. Pham, "A high-gain 60 GHz power amplifier with 20 dBm output power in 90 nm CMOS," IEEE Int. Solid-State Circuits Dig., pp. 426-427, 2009.

S. Kaijun, F. Yong, and H. Zongrui, "Broadband radial waveguide spatial combiner," IEEE Microw. Wireless Comp. Lett., vol. 18, No. 2, pp. 73-75, Feb. 2008.

D. Yazhou, D. Shi-wei, Z. Zhongbo, and W. Ying, "60 GHz low loss, amplitude and phase balanced radial waveguide power combiner," in Proc. Int. Conf. Electronics, Commun. Control (ICECC), Sep. 2011, pp. 4070-4073.

D. Il. De Villiers, P. W. van der Walt, and P. Meyer, "Design of a ten-way conical transmission line power combiner," IEEE Trans. Microw. Theory Tech., vol. 55, No. 2, pp. 302-308, Feb. 2007.

P. T. Timbie, J. Grade, D. van der Weide, B. Maffei, and G. Pisano, "Stereolithographed MM-wave corrugated horn antennas," in Proc. 36th Int. Conf. Infrared, Millim. Terahertz Waves (IRMMW-THz), Oct. 2011, pp. 1-3.

J.-C. S. Chieh, S. Dick, S. Loui, and J. D. Rockway, "Development of a Ku-band corrugated conical horn using 3-D print technology," IEEE Antennas Wireless Propag. Lett., vol. 13, No. , pp. 201-204, 2014.

C. R. Garcia, R. C. Rumpf, H. H. Tsang, and J. H. Barton, "Effects of extreme surface roughness on 3D printed horn antenna," Electron. Lett., vol. 49, No. 12, pp. 734-736, Jun. 2013.

* cited by examiner

FIG. 9 ion, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

ULTRA-WIDEBAND RADIAL WAVEGUIDE TO COAXIAL COMBINER/DIVIDER

CROSS-REFERENCE TO RELATED APPLICATIONS

This application claims the benefit of U.S. Provisional Patent Application Ser. No. 62/309,392 filed Mar. 16, 2016, entitled "Ultra-Wideband Radial Combiner", the content of which is fully incorporated by reference herein.

FEDERALLY-SPONSORED RESEARCH AND DEVELOPMENT

The Ultra-Wideband Radial Waveguide to Coaxial Combiner/Divider is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil; reference Navy Case Number 103527.

BACKGROUND

One of the most stringent blocks in a high-power transmitter is the power amplifier. To obtain the high power (wattage) required many transmitters use vacuum tube technology, otherwise known as travelling wave tube amplifiers (TWTs). Microwave tube amplifiers can generate high power, but have a high mean time to failure as well as narrow bandwidth.

Instead of using vacuum tube technology, solid-state technology has proven to be more reliable and broader in bandwidth. However, most solid-state-technologies are not capable of generating the high power required for various applications. For example, a TWT amplifier might be able to support 100 Watts of power in the Ku-Band (12-18 GHz), whereas a state-of-the-art Gallium Nitride (GaN) solid state amplifier might only be able to support 20 Watts. However, if five GaN amplifiers are used in parallel, the power rating may be increased to support 100 Watts. For this reason, low-loss, high-power combining/dividing technologies are required to "gang-up" numerous solid-state amplifiers to support the high power requirements.

In the microwave/millimeter-wave regime, combiner/divider techniques utilizing printed circuit board (PCB) transmission lines are not preferable because of the high losses. Waveguide transmission lines are preferable instead, since they can handle high power and have very low loss. However, currently available waveguide/coaxial radial combiners/dividers lack wideband operation. Accordingly, a need exists for a wideband radial combiner that efficiently combines multiple solid state amplifiers to provide high power output.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Further, the terms "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

In general, a radial combiner/divider is a combiner for which the input is at the center of a circle and the outputs are located on the radius of the circle. Commercially available waveguide radial combiners are often band limited due in part to the bandwidth restrictions of the transitions that interface between different transmission line modalities, such as waveguide, coaxial, printed circuit board microstrip, etc. In the embodiments disclosed herein, a radial combiner/divider is used to combine a plurality of solid-state amplifiers to increase power handling capability. The embodiments efficiently combine an N-number of wideband solid state amplifiers using a waveguide to coaxial transition that is not only wider in bandwidth than commercially available technology, but also maintains a high level of efficiency.

Figure 1:
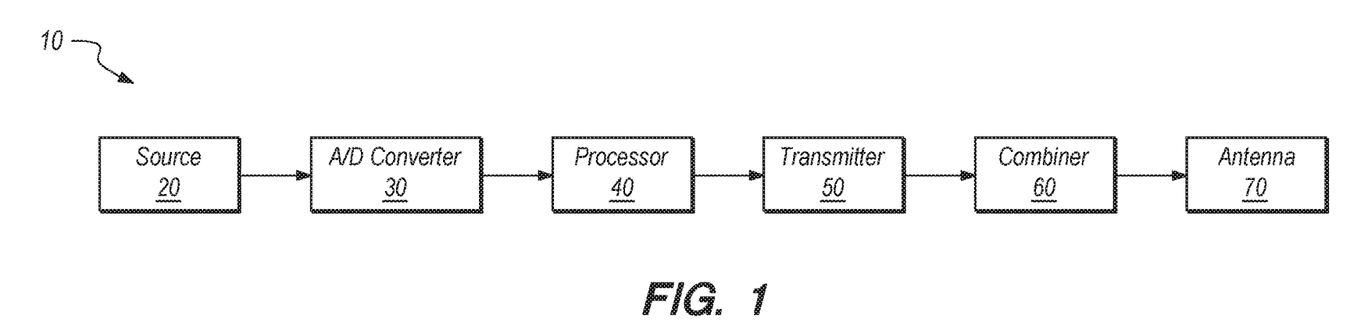
FIG. 1 shows a block diagram of an embodiment of a communications system incorporating an embodiment of the Ultra-Wideband Radial Waveguide to Coaxial Combiner/Divider.

FIG. 1 shows a block diagram of an embodiment of a communications system 10 incorporating an Ultra-Wideband Radial Waveguide to Coaxial Combiner/Divider. System 10 includes a source 20, A/D converter 30, processor 40, transmitter 50, radial combiner 60, and antenna 70. It should be recognized that the components used in system 10 are for illustrative purposes and that the embodiments of the combiner/divider disclosed herein may be used in communications systems having different configurations as well as other types of systems where combining amplifiers is necessary. In operation, a signal is directed from analog source 20 to A/D converter 30, where the signal is converted to a digital signal. The digital signal is then processed by processor 40, directed to transmitter 50, and passed to combiner 60. Combiner 60 amplifies the signal and then passes the signal to antenna 70 for transmission.

Figure 2A:
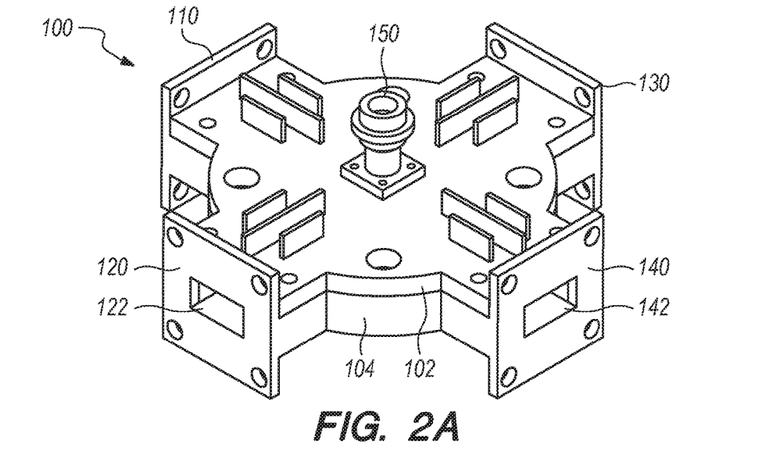
FIG. 2A shows an isometric top down view of an embodiment of the Ultra-Wideband Radial Waveguide to Coaxial Combiner/Divider.
Figure 2B:
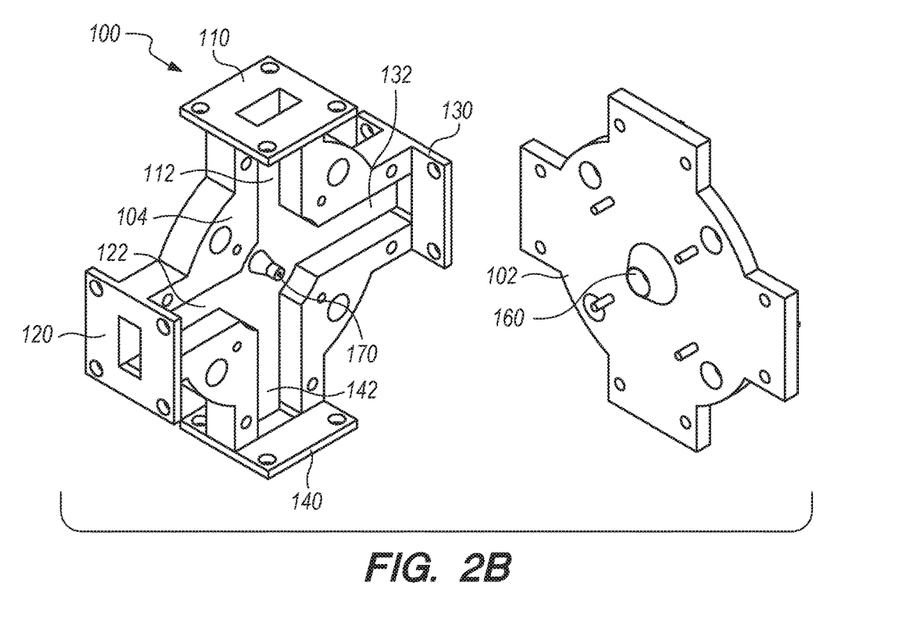
FIG. 2B shows a view of the inside of the system shown in FIG. 2A.
Figure 2C:
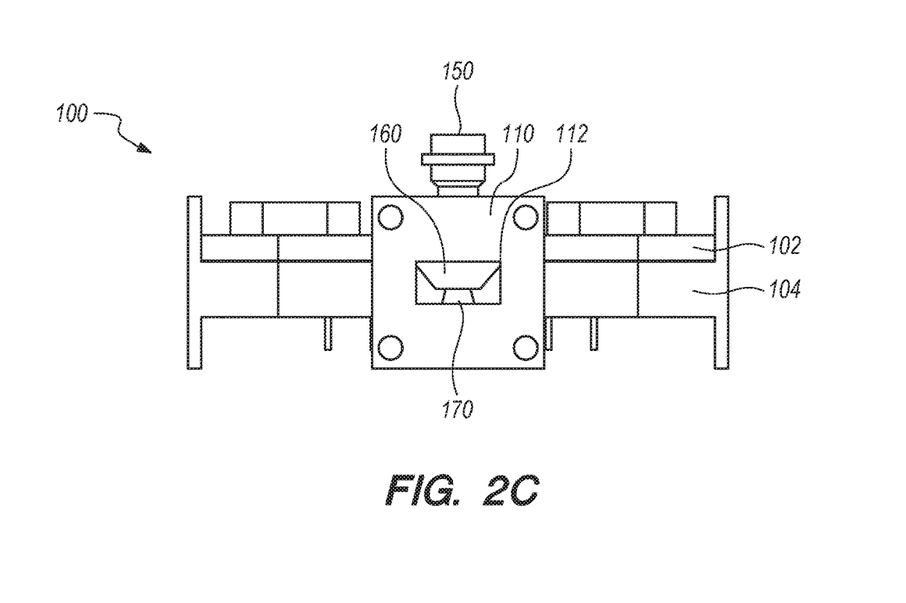
FIG. 2C shows an end view of the system shown in FIG. 2A, illustrating the location of the radial transition.
Figure 2D:
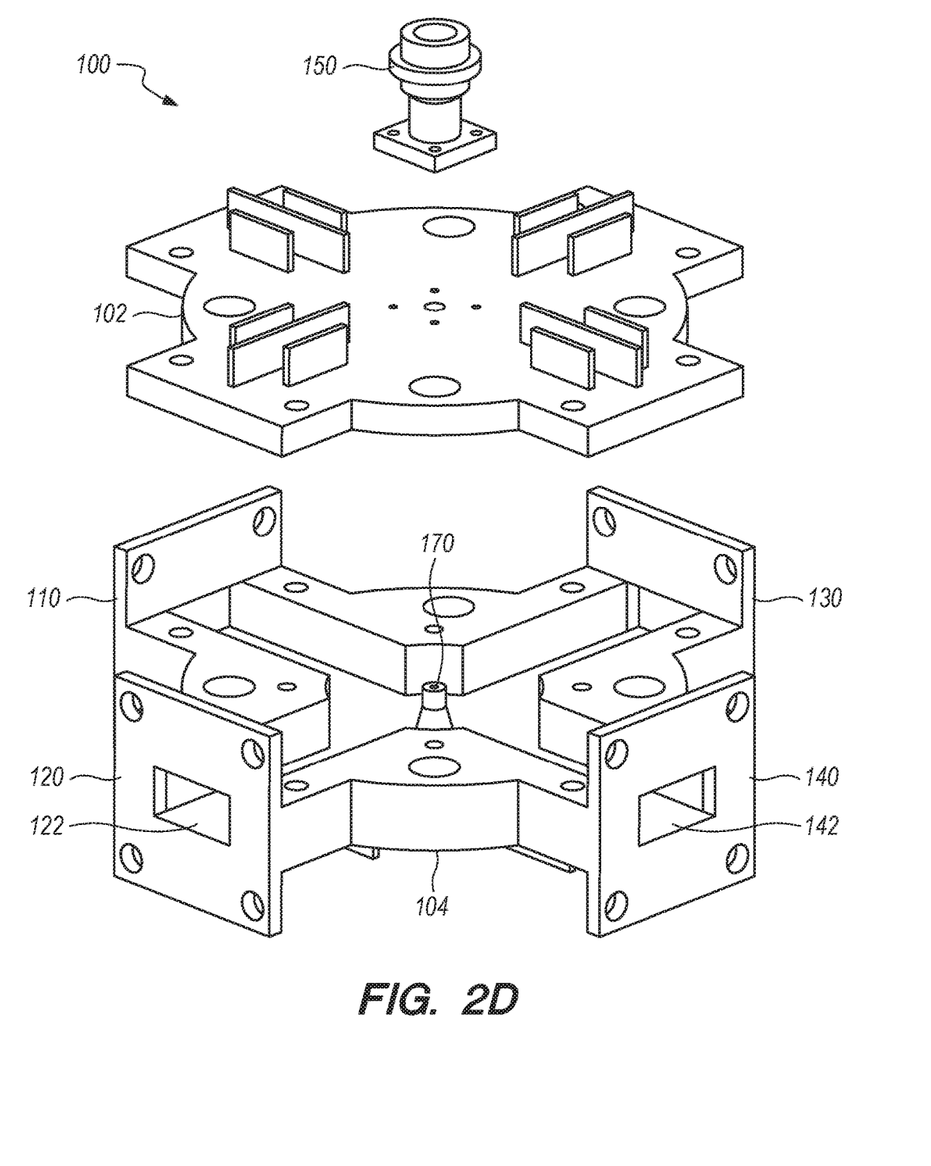
FIG. 2D shows an exploded view of the system shown in FIG. 2A.

Referring to FIGS. 2A-2D, FIG. 2A shows an isometric top down view of a radial combiner 100, FIG. 2B shows a view of the inside of combiner 100, and FIG. 2C shows an end view of combiner 100, illustrating the location of an embodiment of a radial transition within combiner 100, and FIG. 2D shows an exploded view of combiner 100. It should be recognized that combiner 100 may also function as a divider, but the term combiner will be used for illustrative purposes. Combiner 100 comprises a top plate 102 and a bottom plate 104, defining four waveguide ports 110, 120, 130, and 140, each defining waveguides 112, 122, 132, and 142. An input 150 is coupled to top plate 102 to allow for the connection of a coaxial connector such as connector 370 shown in FIGS. 3A-3C.

It should be recognized by one having ordinary skill in the art that embodiments of the combiner/divider disclosed herein may have more or less waveguides than the four as shown in combiner 100 to split a signal into n separate signals for amplification or to combine n separate signals that have been amplified. In theory, the number of combining/dividing elements that may be obtained is infinite because the radius of the radial waveguide can be increased to support n-number of elements. Practically, the number of solid-state amplifiers that can be combined will be limited based upon the space and size of the waveguide connection that is required (dictated by frequency) and the increased loss due to expanding the radius of the radial waveguide. As a practical example, n may be less than or equal to 32.

As shown best in FIG. 2B, the radial transition is formed within combiner 100. More specifically, combiner 100 includes a first rigid portion 160 protruding from top plate 102 towards bottom plate 104, as well as second and third rigid portions, shown as reference 170, protruding from bottom plate 104 towards top plate 102. FIG. 2C shows an end view within waveguide 112 illustrating how the second rigid portion, shown by reference 170, is partially disposed within first rigid portion 160 when combiner 100 is assembled.

Figure 3A:
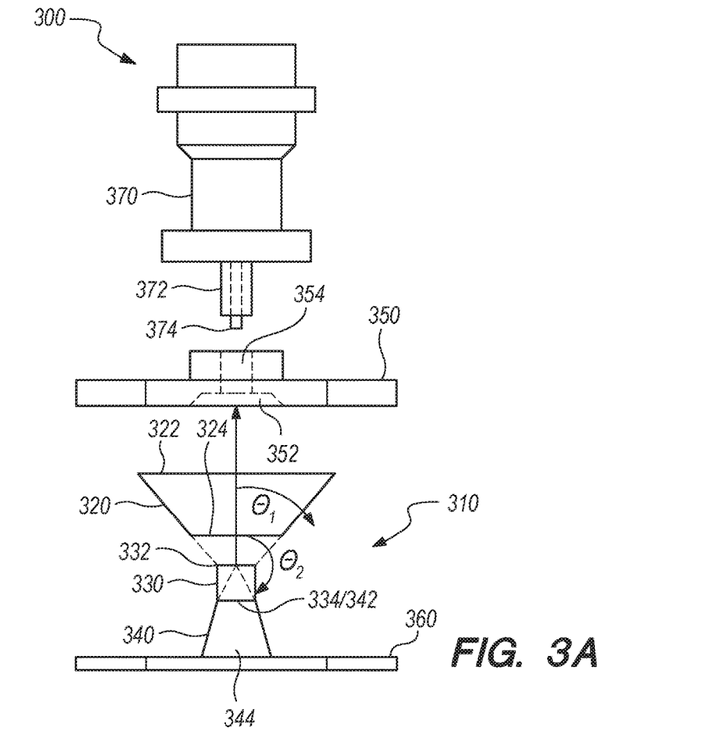
FIG. 3A shows an exploded view diagram of a radial transition that may be used within an embodiment of system in accordance with the Ultra-Wideband Radial Waveguide to Coaxial Combiner/Divider.
Figure 3B:
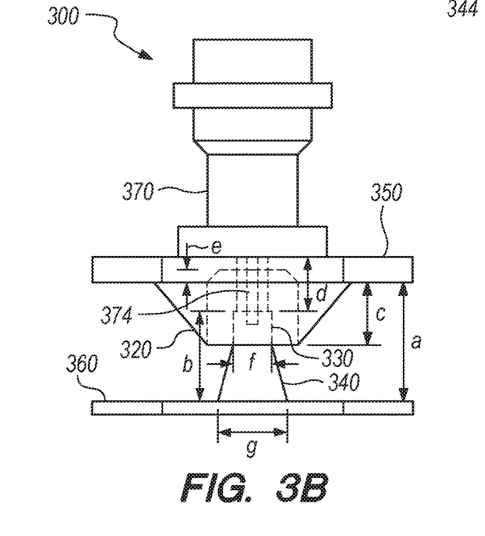
FIG. 3B shows an assembled view of the system shown in FIG. 3A.
Figure 3C:
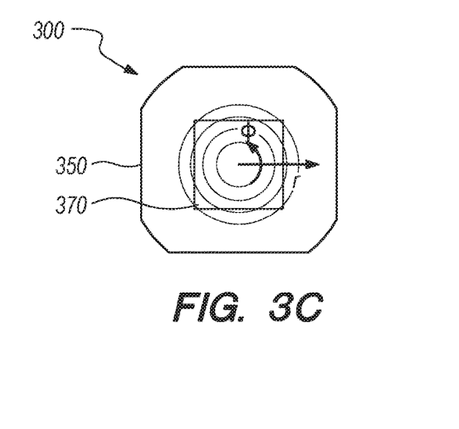
FIG. 3C shows a top view of the system shown in FIG. 3A.

FIGS. 3A-3C show diagrams of a system 300 including an embodiment of a radial transition 310, with FIG. 3A showing an exploded view diagram, FIG. 3B showing an assembled view, and FIG. 3C showing a top view. Transition 310 includes a first rigid portion 320 comprising an inverted hollow cone, a second rigid portion 330 comprising a hollow tube, and a third rigid portion 340 comprising a hollow cone. First rigid portion 320 has a first end 322 and a second end 324. First rigid portion 320 tapers inward at a first angle from first end 322 towards second end 324. Second rigid portion 330 has a first end 332 and a second end 334. First end 332 is at least partially disposed within second end 324 of first rigid portion 320. As an example, first end 332 is disposed 1 mm within second end 324, but other depths may be suitable depending upon the application and requirements. Third rigid portion 340 has a first end 342 and a second end 344. First end 342 is at least partially disposed within second end 334 of second rigid portion 330. Third rigid portion 340 tapers outward at a second angle from first end 342 towards second end 344.

In some embodiments, the second angle is less than the first angle. As an example, the second angle is about 90 degrees and the first angle is about 148 degrees. In some embodiments, the second angle is equal to the first angle. In some embodiments, the second angle is more than the first angle. In some embodiments, the first angle and the second angle are determined according to the equation $$Z_c = \frac{1}{2\pi}\sqrt{\frac{\mu}{\epsilon}} \ln \frac{\tan\left(\frac{\theta_2}{2}\right)}{\tan\left(\frac{\theta_1}{2}\right)},$$

where $Z_c$ is the impedance, $\mu$ is permeability of a medium, $\epsilon$ is permittivity of the medium, such as air, $\theta_1$ is the first angle, and $\theta_2$ is the second angle.

The dimensions of the components of transition 310 may vary depending upon the particular application and system requirements. The following dimensions are provided as an illustrative example for a particular configuration. It should be recognized that even with the particular configuration, such dimensions may vary slightly from the numbers given without departing from the intended operation. Accordingly, first rigid portion 320, second rigid portion 330, and third rigid portion 340 may have a combined height of about 11 mm, such that the distance a is 11 mm, the distance b of first end 332 of second rigid portion 330 to the top surface of bottom plate 360 is 7.9 mm, the distance c of second end 334 of second rigid portion 330 to the bottom surface of top plate 350 is 5.25 mm, and the distance d of first end 332 of second rigid portion 330 to the top surface of top plate 350 is 4.7 mm.

Further, the height e of a tapered inset 352 within top plate 350 is 1 mm, the diameter of first end 322 of first rigid portion 320 may be about 12 mm, the diameter of second end 324 of first rigid portion 320 may be about 6.1 mm, the diameter f of first end 332 and second end 334 of second rigid portion 330 may be about 3.5 mm, the diameter of first end 342 of third rigid portion 340 may be about 3.5 mm, and the diameter g of second end 344 of third rigid portion 340 may be about 6.1 mm. These dimensions may be used for wideband operation in the Ku-Band, but the general design as discussed above is applicable at various dimensions for operation in any useable frequency band.

In some embodiments, system 300 further includes a waveguide comprising a top plate 350 and a bottom plate 360. In some embodiments, top plate 350 is separated from bottom plate 360 by a distance of about 10 mm. It should be recognized by a person having ordinary skill in the art that the distance between top plate 350 and bottom plate 360 may vary depending upon the particular application or system requirements.

In some embodiments, transition 310 is a stand-alone unit that is incorporated into system 300. In other embodiments, one or more portions of transition 310 are formed as part of another component within system 300. For example, in the stand-alone embodiments, the first end 322 of first rigid portion 320 is in contact with top plate 350. In the other embodiments, first rigid portion 320 is built within the top plate as is shown in FIG. 2B with first rigid portion 160 protruding from top plate 102, and the second rigid portion and third rigid portion (both shown as reference 170) are built within the bottom plate 104. In some embodiments, second rigid portion 330 is electrically connected to top plate 350. In such embodiments, the second end 344 of third rigid portion 340 is connected to the bottom plate.

Top plate 350 has an opening 354 therein configured to receive a pin 374 of a coaxial connector 370 therethrough. Connector 370 is comprised of a metal pin 374 surrounded by a dielectric (Teflon) bead 372 to hold pin 374 in place. As an example, pin 374 may have a diameter of 0.91 mm and the coax dielectric bead 372 may have a diameter of 2.94 mm. In some embodiments, top plate 350, first rigid portion 320, second rigid portion 330, and third rigid portion 340 are sized such that when pin 374 of coaxial cable 370 passes through opening 354, pin 374 becomes electrically connected to third rigid portion 340. As shown in FIGS. 3A-3C, an N-type coaxial connector 370 is used. However, the coaxial line could have any coaxial connector.

The design of transition 310 is advantageous in that it increases the frequency bandwidth of commonly used coaxial to waveguide transition by about 28% when compared to a state of the art single top conical taper. Further, it increases the bandwidth of the transition by about 42% when compared to a state of the art single bottom conical taper.

Figure 4:
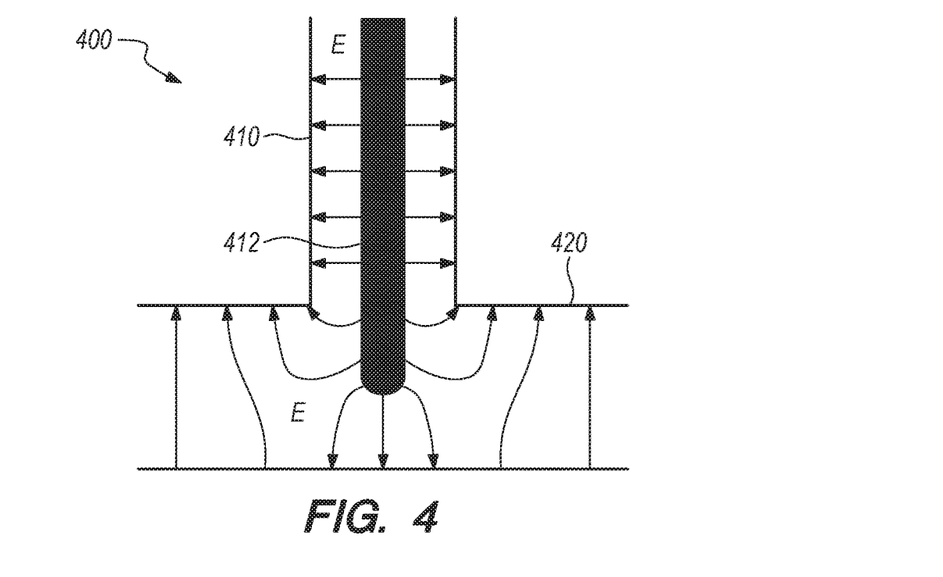
FIG. 4 shows a cross-section diagram of a coaxial cable connected to a waveguide, illustrating the transition of electric field lines of the coaxial conductor into the waveguide without using a transition device.

FIG. 4 shows a cross-section diagram 400 of a coaxial cable 410 connected to a waveguide 420, illustrating the transition of electric field lines of the coaxial conductor into the waveguide without using a transition device. In a coaxial line 410, an electric field exists from the inner conductor 412 to the outer conductor (outer lines representing 410) and is completely contained within the coaxial line 410. When coaxial line 410 transitions to a waveguide 420, the outer coaxial conductor is electrically connected to the waveguide conductive walls and the inner coaxial conductor 412 protrudes in the waveguide cavity, as shown. The electric field that exists within coaxial line 410 will now propagate in waveguide 420 while being contained between the waveguide walls. The spacing between inner conductor 412 and the walls of waveguide 420 is specifically designed for a particular signal frequency and works efficiently only at a narrow range of frequencies.

Figure 5:
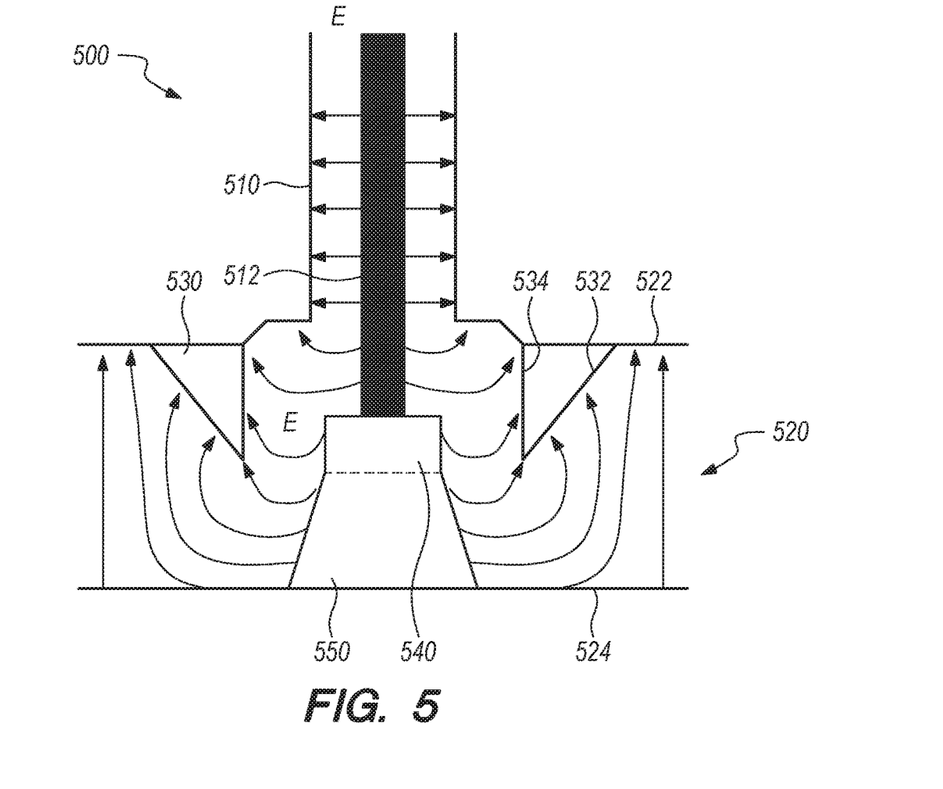
FIG. 5 shows a cross-section diagram of a coaxial cable connected to a waveguide, illustrating the transition of electric field lines of the coaxial conductor into the waveguide using a radial transition.

FIG. 5 shows a cross-section diagram 500 of a coaxial cable 510 connected to a waveguide 520, illustrating the transition of electric field lines of coaxial conductor 512 into waveguide 520 using a radial transition. As shown, waveguide 520 is a parallel plate waveguide having a top plate 522 and a bottom plate 524. The transition includes first rigid portion 530, second rigid portion 540, and third rigid portion 550. First rigid portion 530 is configured the same as first rigid portion 320 (shown in FIG. 3A), second rigid portion 540 is configured the same as second rigid portion 330, and third rigid portion 550 is configured the same as third rigid portion 340. As shown, first rigid portion 530 has an outer wall 532 and an inner wall 534. Further, a first end of first rigid portion 530 is in contact with top plate 522 and a second end of third rigid portion 550 is connected to bottom plate 524.

As shown, the electric field lines emanating from coaxial conductor 512 within coaxial cable 510 are essentially parallel with waveguide 520. As the electric field lines transition into the region defined by inner wall 534, the electric field lines begin to expand out to fill the region, curving significantly beginning where conductor 512 meets second rigid portion 540, but still contained by inner wall 534. Upon reaching third rigid portion 550, the electric field lines are no longer contained by inner wall 534 and transition outwardly into waveguide 520 between top plate 522 and bottom plate 524. The electric field lines curve upward and outward from third rigid portion 550 until the electric field lines eventually become substantially vertical within waveguide 520, as shown.

The conical tapers of the transition, i.e. first rigid portion 530 and third rigid portion 530, allow the transition from the coaxial conductor 510 to waveguide 520 to be performed efficiently at a wide range of frequencies. This occurs because the spacing between the conductors is not one set length, but rather contains the optimal spacing for many different frequencies between the tapered portions. The transition disclosed above may be suitable for many applications and in various devices.

Figure 6:
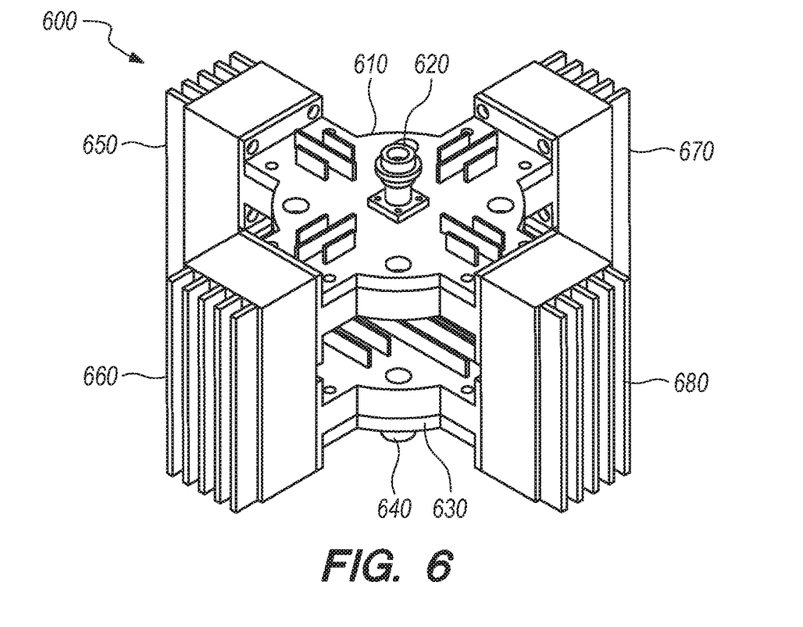
FIG. 6 shows an embodiment of the Ultra-Wideband Radial Waveguide to Coaxial Combiner/Divider having an input combiner/divider combined with an output combiner/divider using amplifiers.

FIG. 6 shows an embodiment of the Ultra-Wideband Radial Waveguide to Coaxial Combiner/Divider 600 having an input combiner/divider combined with an output combiner/divider using amplifiers. System 600 includes a divider 610 having a coaxial input port 620, a combiner 630 having a coaxial output port 640, and amplifiers 650, 660, 670, and 680. In some embodiments, divider 610 and combiner 630 have the same configurations, with their operations being performed in reverse. As an example, divider 610 and combiner 630 are configured the same as system 100 shown in FIGS. 2A-2D using the transition shown in FIGS. 3A-3C.

As shown in FIG. 6, a first plurality of N waveguides of divider 610 is radially disposed around a first transition within divider 610, where a first end of each of the first plurality of waveguides is operatively connected to coaxial input port 620 via the first transition. A second plurality of N waveguides of combiner 630 is radially disposed around a second transition within combiner 630, where a first end of each of the second plurality of waveguides is operatively connected to coaxial output port 640 via the second transition. The first transition and the second transition each are configured as shown in FIGS. 3A-3C. System 600 further includes a plurality of N amplifiers 650, 660, 670, and 680 each having a first port and a second port, where the first port of each of the plurality of amplifiers is connected to a second end of one of the first plurality of waveguides and the second port of each of the plurality of amplifiers is connected to a second end of one of the second plurality of waveguides.

In some embodiments, and as shown in FIG. 6, the first plurality of waveguides and the first transition are disposed directly on top of the second plurality of waveguides and the second transition, such that the waveguide of the first plurality of waveguides connected to a first port of one of the plurality of amplifiers is located above the waveguide of the second plurality of waveguides connected to the second port of that one of the plurality of amplifiers.

In operation, a signal, such as from transmitter 50 shown in FIG. 1, is input into coaxial input port 620 and then split by divider 610 and directed to amplifiers 650, 660, 670, and 680. Upon amplification, combiner 630 coherently combines the amplified signals, the result of which is output via coaxial output port 640 to, for example, an antenna such as shown in FIG. 1.

Figure 7:
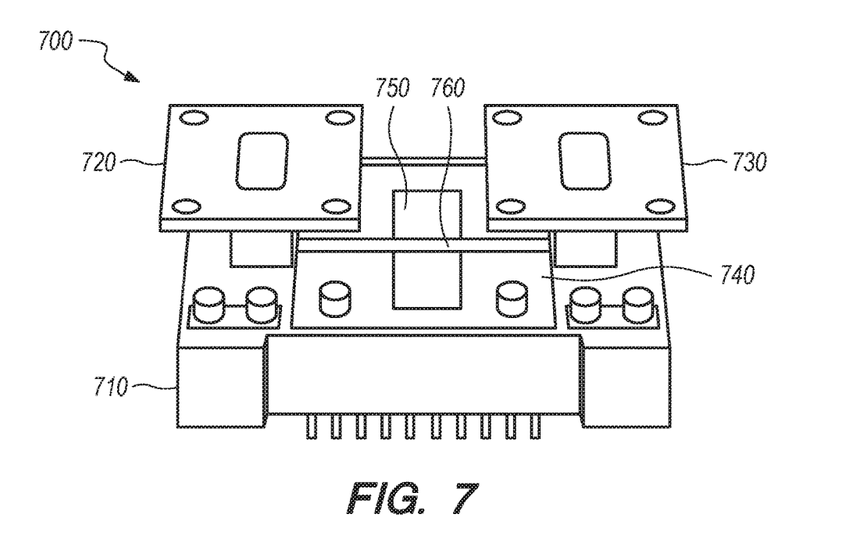
FIG. 7 shows an embodiment of a two-port solid-state amplifier that may be used in the embodiment of the Ultra-Wideband Radial Waveguide to Coaxial Combiner/Divider shown in FIG. 6.

As an example, amplifiers 650, 660, 670, and 680 may be configured the same as the two-port solid-state amplifier 700 as shown in FIG. 7. Amplifier 700 includes a body portion 710, a first port 720, and a second port 730. A circuit board 740 is secured to body portion 710. Circuit board 740 contains amplifier 750 and a micro-strip transition line 760 that allows the signal to propagate from a first waveguide through first port 720 to amplifier 750 and then second port 730, where it is then directed through a second waveguide.

It should be recognized by a person having ordinary skill in the art that two-port solid-state amplifiers having different configurations may be used within the combiner/divider system shown herein. As an example, amplifier 700 may be a solid-state GaN power amplifier that provides 25 Watts at the Ku-band and 9 Watts at the Ka-band. However, other solid-state amplifiers comprising different materials and having different power outputs may be utilized for particular applications as recognized by one having ordinary skill in the art.

Figure 8:
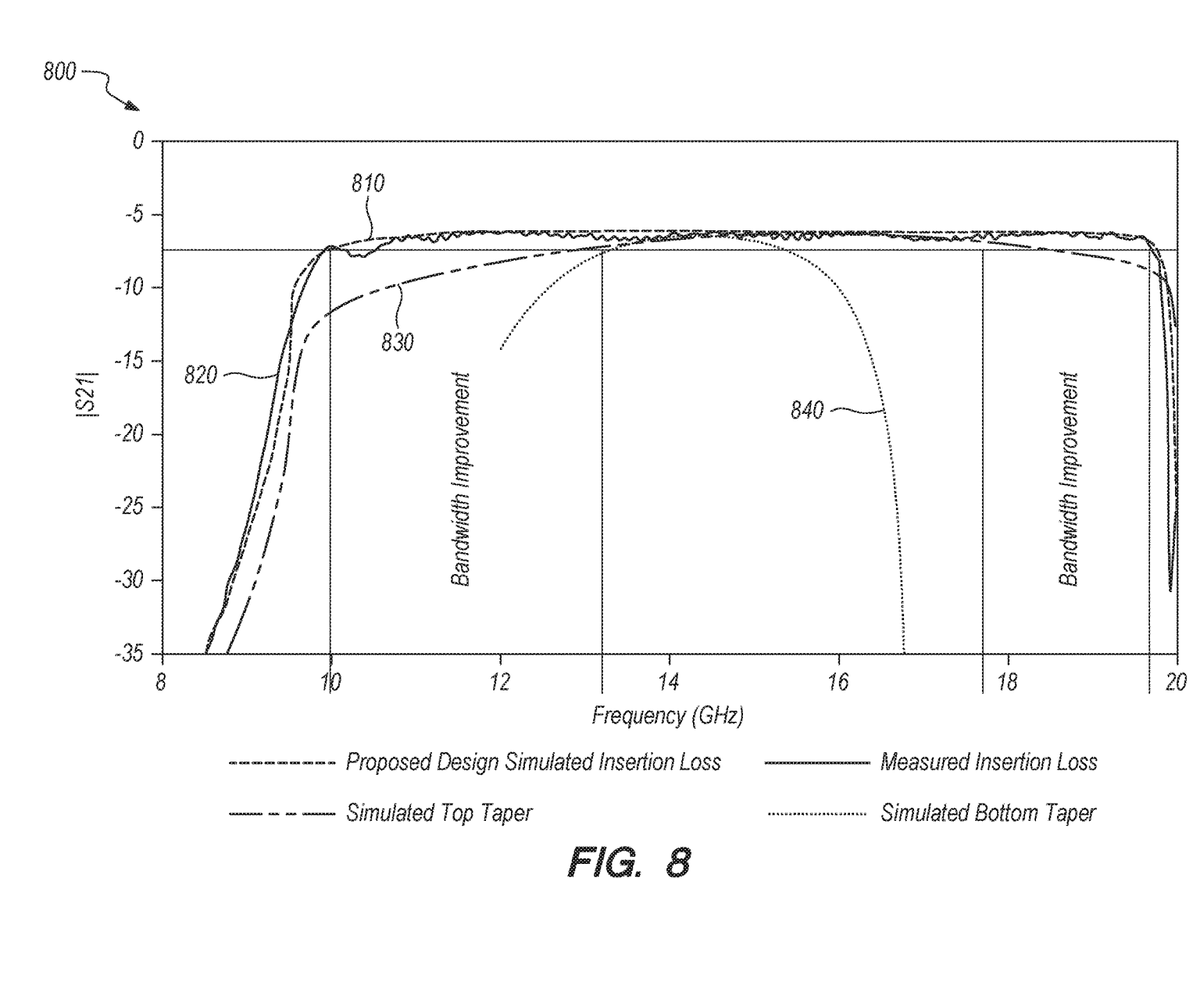
FIG. 8 shows a graph illustrating the simulated and measured insertion loss of the system shown in FIGS. 2A-2D.

FIG. 8 shows a graph 800 illustrating the simulated and measured insertion loss of combiner 100 including the radial transition. As shown, line 810 represents the proposed design simulated insertion loss, line 820 represents the measured insertion loss, line 830 represents a simulated top taper (with no bottom taper) of a separate state-of-the art transition, and line 840 represents a simulated bottom taper (with no top taper) of a separate state-of-the art transition.

The ideal loss for a 4-1 combiner/divider from the N-type threaded input to the rectangular waveguide output arms is 75% loss due to the 1:4 power splitting (6 dB loss). It can be seen from lines 810 and 820 that the transition incorporates nearly zero additional loss over a 2:1 bandwidth (10-20 GHz), which is remarkably wideband. Further, the bandwidth of the two transitions represented by lines 830 and 840 operate over a much narrower frequency range (every 10 units on the y-axis is a factor of 10× loss), indicating the advantages of the embodiments of the transition disclosed herein versus the compared transitions represented by lines 830 and 840.

Figure 9:
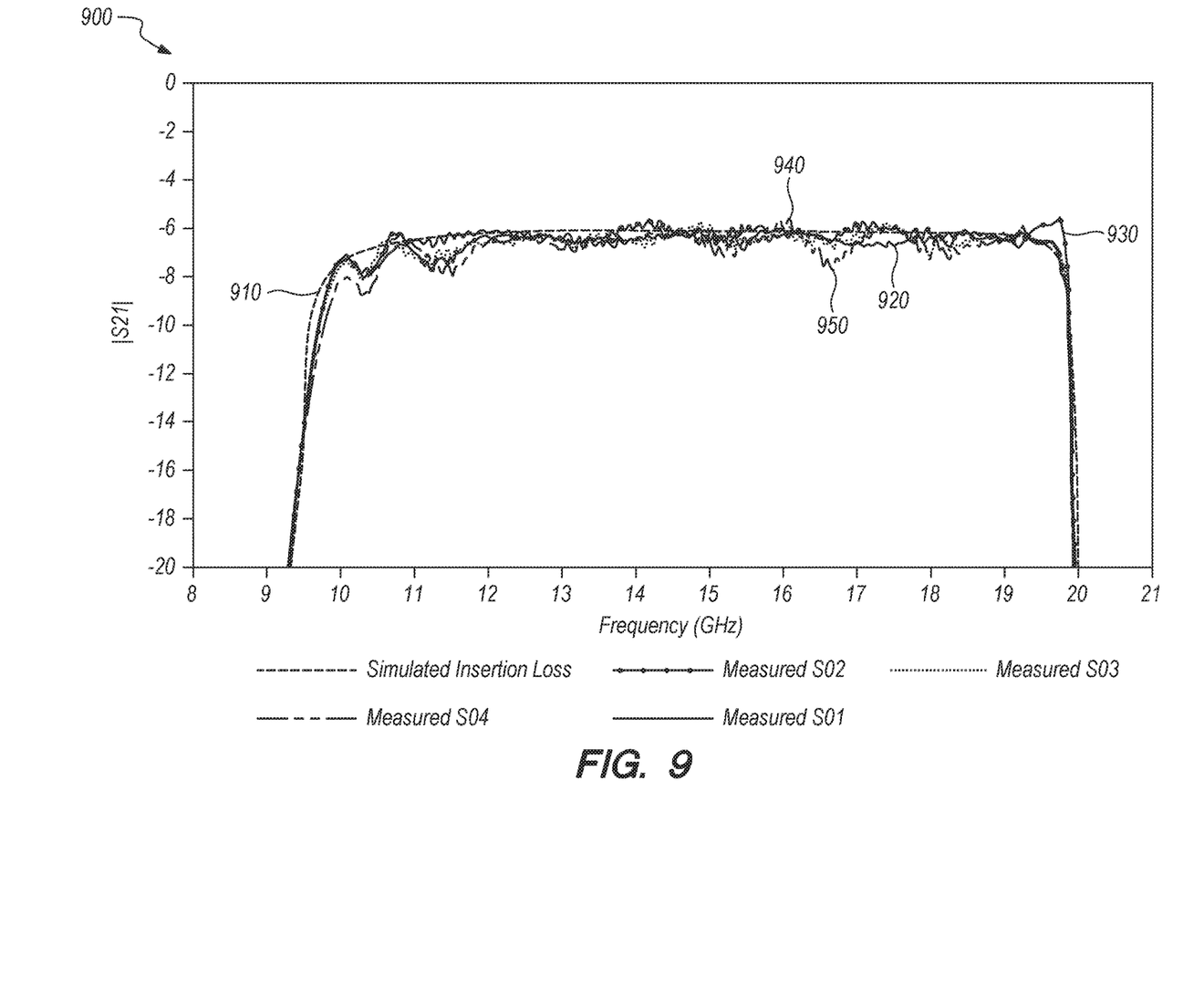
FIG. 9 shows a graph illustrating the simulated and measured insertion loss of all four waveguide ports of the system shown in FIGS. 2A-2D.

FIG. 9 shows a graph 500 illustrating the simulated and measured insertion loss of all four waveguide ports of combiner 300 as shown in FIGS. 2A-2C. Graph 500 shows the output at each waveguide port, with line 510 representing the simulated insertion loss, line 520 represents the measured insertion loss of a first port, line 530 represents the measured insertion loss of a second port, line 530 represents the measured insertion loss of a third port, and line 540 represents the measured insertion loss of a fourth port. Graph 500 shows that the transition successfully provides a wideband operation with consistent responses for each waveguide port and a low standard deviation.

Many modifications and variations of the Ultra-Wideband Radial Waveguide to Coaxial Combiner/Divider are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:

1. A system comprising:
   a coaxial port;
   a plurality of waveguides each having a first end and a second end; and
   a transition disposed between the coaxial port and the first end of each of the plurality of waveguides, wherein the waveguides are radially disposed around the transition, wherein the transition comprises
      a first rigid portion comprising an inverted hollow cone, the first rigid portion having a first end and a second end, wherein the first rigid portion tapers inward at a first angle from the first end towards the second end,
      a second rigid portion comprising a hollow tube, the second rigid portion having a first end and a second end, wherein the first end of the second rigid portion is at least partially disposed within the second end of the first rigid portion, and
      a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end, wherein the second angle is less than the first angle.

2. The system of claim 1, wherein the plurality of waveguides are formed between a top plate and a bottom plate, wherein the first end of the first rigid portion is in contact with the top plate, wherein the coaxial port is formed within the top plate.

3. The system of claim 2, wherein the second rigid portion is electrically connected to the top plate.

4. The system of claim 3, wherein the second end of the third rigid portion is connected to the bottom plate.

5. The system of claim 2, wherein the top plate has an opening therein configured to receive a pin of a coaxial cable therethrough.

6. The system of claim 5, wherein the top plate, the first rigid portion, the second rigid portion, and the third rigid portion are sized such that when the pin of the coaxial cable passes through the opening, the pin becomes electrically connected to the third rigid portion.

7. The system of claim 1, wherein the first angle and the second angle are determined according to the equation $Z_c = \frac{1}{2}\pi\sqrt{\mu/\in} * \ln*(\tan(\theta_2/2)/\tan(\theta_1/2))$, where $Z_c$ is an impedance, $\mu$ is permeability of a medium, $\in$ is permittivity of the medium, $\theta_1$ is the first angle, and $\theta_2$ is the second angle.

8. The system of claim 1 further comprising a plurality of amplifiers connected to the plurality of waveguides, wherein one separate amplifier of the plurality of amplifiers is connected to the second end of one separate waveguide of the plurality of waveguides.

9. The system of claim 8, wherein the plurality of amplifiers comprise solid-state amplifiers.

10. The system of claim 8, wherein the coaxial port is operatively connected to a transmitter and the plurality of amplifiers are operatively connected to an antenna.

11. A system comprising:
a coaxial input port;
a coaxial output port;
a first plurality of N waveguides radially disposed around a first transition, wherein a first end of each of the first plurality of waveguides is operatively connected to the coaxial input port via the first transition;
a second plurality of N waveguides radially disposed around a second transition, wherein a first end of each of the second plurality of waveguides is operatively connected to the coaxial output port via the second transition; and
a plurality of N amplifiers each having a first port and a second port, wherein the first port of each of the plurality of amplifiers is connected to a second end of one of the first plurality of waveguides and the second port of each of the plurality of amplifiers is connected to a second end of one of the second plurality of waveguides.

12. The system of claim 11, wherein the first plurality of waveguides and the first transition are disposed directly on top of the second plurality of waveguides and the second transition.

13. The system of claim 12, wherein the waveguide of the first plurality of waveguides connected to a first port of one of the plurality of amplifiers is located above the waveguide of the second plurality of waveguides connected to the second port of that one of the plurality of amplifiers.

14. The system of claim 11, wherein the coaxial input port is operatively connected to a transmitter and the coaxial output port is operatively connected to an antenna.

15. The system of claim 11, wherein the first transition and the second transition each comprise a first rigid portion comprising an inverted hollow cone, the first rigid portion having a first end and a second end, wherein the first rigid portion tapers inward at a first angle from the first end towards the second end, a second rigid portion comprising a hollow tube, the second rigid portion having a first end and a second end, wherein the first end of the second rigid portion is at least partially disposed within the second end of the first rigid portion, and a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end, wherein the second angle is less than the first angle.

16. The system of claim 11, wherein the first angle and the second angle are determined according to the equation $Z_c = 1/2\pi\sqrt{\mu/\epsilon} * \ln*(\tan(\theta_2/2)/\tan(\theta_1/2))$, where $Z_c$ is an impedance, $\mu$ is permeability of a medium, $\epsilon$ is permittivity of the medium, $\theta_1$ is the first angle, and $\theta_2$ is the second angle.

17. A system comprising:
a coaxial input port;
a coaxial output port;
a first plurality of N waveguides radially disposed around a first transition, wherein a first end of each of the first plurality of waveguides is operatively connected to the coaxial input port via the first transition;
a second plurality of N waveguides radially disposed around a second transition, wherein a first end of each of the second plurality of waveguides is operatively connected to the coaxial output port via the second transition, wherein the first transition and the second transition each comprise a first rigid portion comprising an inverted hollow cone, the first rigid portion having a first end and a second end, wherein the first rigid portion tapers inward at a first angle from the first end towards the second end, a second rigid portion comprising a hollow tube, the second rigid portion having a first end and a second end, wherein the first end of the second rigid portion is at least partially disposed within the second end of the first rigid portion, and a third rigid portion comprising a hollow cone, the third rigid portion having a first end and a second end, wherein the first end of the third rigid portion is at least partially disposed within the second end of the second rigid portion, wherein the third rigid portion tapers outward at a second angle from the first end towards the second end, wherein the second angle is less than the first angle; and
a plurality of N amplifiers each having a first port and a second port, wherein the first port of each of the plurality of amplifiers is connected to a second end of one of the first plurality of waveguides and the second port of each of the plurality of amplifiers is connected to a second end of one of the second plurality of waveguides.

18. The system of claim 17, wherein the first plurality of waveguides and the first transition are disposed directly on top of the second plurality of waveguides and the second transition, wherein the waveguide of the first plurality of waveguides connected to a first port of one of the plurality of amplifiers is located above the waveguide of the second plurality of waveguides connected to the second port of that one of the plurality of amplifiers.

19. The system of claim 17, wherein the coaxial input port is operatively connected to a transmitter and the coaxial output port is operatively connected to an antenna.

20. The system of claim 17, wherein the first angle and the second angle are determined according to the equation $Z_c = 1/2\pi\sqrt{\mu/\epsilon} * \ln*(\tan(\theta_2/2)/\tan(\theta_1/2))$, where $Z_c$ is an impedance, $\mu$ is permeability of a medium, $\epsilon$ is permittivity of the medium, $\theta_1$ is the first angle, and $\theta_2$ is the second angle.

* * * * *